(12) United States Patent
Yang et al.

(10) Patent No.: US 6,699,785 B2
(45) Date of Patent: Mar. 2, 2004

(54) CONDUCTOR ABRASIVELESS CHEMICAL-MECHANICAL POLISHING IN INTEGRATED CIRCUIT INTERCONNECTS

(75) Inventors: Kai Yang, San Jose, CA (US); Kashmir S. Sahota, Fremont, CA (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/375,219

(22) Filed: Feb. 26, 2003

(65) Prior Publication Data

US 2003/0146512 A1 Aug. 7, 2003

Related U.S. Application Data

(62) Division of application No. 09/716,012, filed on Nov. 18, 2000, now abandoned.

(51) Int. Cl.[7] .......................................... H01L 21/4763
(52) U.S. Cl. ........................ 438/639; 438/637; 257/774
(58) Field of Search .......................... 257/774; 438/637, 438/639

(56) References Cited

U.S. PATENT DOCUMENTS

| 6,001,730 | A | * | 12/1999 | Farkas et al. ................ 438/627 |
| 6,375,545 | B1 | * | 4/2002 | Yano et al. ..................... 451/36 |
| 6,396,557 | B1 | * | 5/2002 | Tajima ........................ 349/150 |
| 6,435,942 | B1 | * | 8/2002 | Jin et al. ........................ 451/8 |
| 6,514,126 | B1 | * | 2/2003 | Vanell .......................... 451/72 |

* cited by examiner

*Primary Examiner*—Michael S. Lebentritt
*Assistant Examiner*—Christian D. Wilson
(74) *Attorney, Agent, or Firm*—Mikio Ishimaru

(57) ABSTRACT

A manufacturing method is provided having a semiconductor substrate with a semiconductor device. A device dielectric layer is formed on the semiconductor substrate. A channel dielectric layer on the device dielectric layer has an opening formed therein. A barrier layer lines the channel opening. A conductor core fills the opening over the barrier layer. By using a polishing solution having a high selectivity from the conductor core to the barrier layer in conjunction with a grooved polyurethane polish pad, a very thin barrier layer may be used without the conductor core and dielectric layer being subject to erosion and the conductor core being subject to dishing.

10 Claims, 3 Drawing Sheets

CONDUCTOR ABRASIVELESS CHEMICAL-MECHANICAL POLISHING IN INTEGRATED CIRCUIT INTERCONNECTS

CROSS-REFERENCE TO RELATED APPLICATIONS

This is a Divisional of application Ser. No. 09/716,012 filed Nov. 18, 2000, now abandoned.

The present application also contains subject matter related to co-pending U.S. patent application Ser. No. 10/197,067 by Kashmir S. Sahota, Kai Yang, and Steven C. Avanzino entitled "CONDUCTOR CHEMICAL-MECHANICAL POLISHING IN INTEGRATED CIRCUIT INTERCONNECTS", which is a divisional of U.S. patent application Ser. No. 09/715,670, now abandoned.

TECHNICAL FIELD

The present invention relates generally to semiconductor technology and more specifically to chemical-mechanical polishing solutions and pads in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of materials such as tantalum (Ta), titanium (Ti), tungsten (W), and their nitrides which are good barrier materials and have good adhesion to the dielectric materials.

Good barrier materials provide resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electro-less deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One of the major problems encountered during the CMP process is that the various solutions used to provide the chemical portion of the process do not have high selectivity from the conductor material, such as copper (Cu) to the barrier materials, such as tantalum (Ta) or tantalum nitride (TaN). The current selectivity is in the range of 20:1 selectivity of copper to tantalum or tantalum nitride.

As a result of the lack of high selectivity to the barrier material, when the barrier layer is polished away, both the channels and dielectric layers are subject to "erosion", or undesirable CMP of the channel and dielectric materials, which makes it difficult to control the channel thickness.

Also, because of the lack of high selectivity to the barrier material, when the barrier layer is polished away, the channels alone are subject to "dishing", or undesirable CMP of the conductor material, which also makes it difficult to control the channel thickness.

One problematic answer to this problem has been to provide very thick barrier layers, which provide large process margins during CMP. Unfortunately, these materials have relatively high resistance and tend to reduce the overall current-carrying capability of the channels.

Solutions to these problems have been long sought but have long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening, and a conductor material fills the opening over the barrier layer. By using a polishing solution having a high selectivity from the barrier layer to the dielectric layer, a very thin barrier layer may be used without causing the channels and the dielectric layer to be subject to conventional erosion or the channels being subject to conventional dishing. As a result, improved channel thickness control is achieved and the conductivity of the channel is improved.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and conductor core is deposited to fill the channel opening over the barrier layer. By using a polishing solution having a high selectivity from the barrier layer to the dielectric layer, a very thin barrier layer may be used without causing the channels and the dielectric layer to be subject to conventional erosion or the channels being subject to conventional dishing. As a result, improved process margins are achieved.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
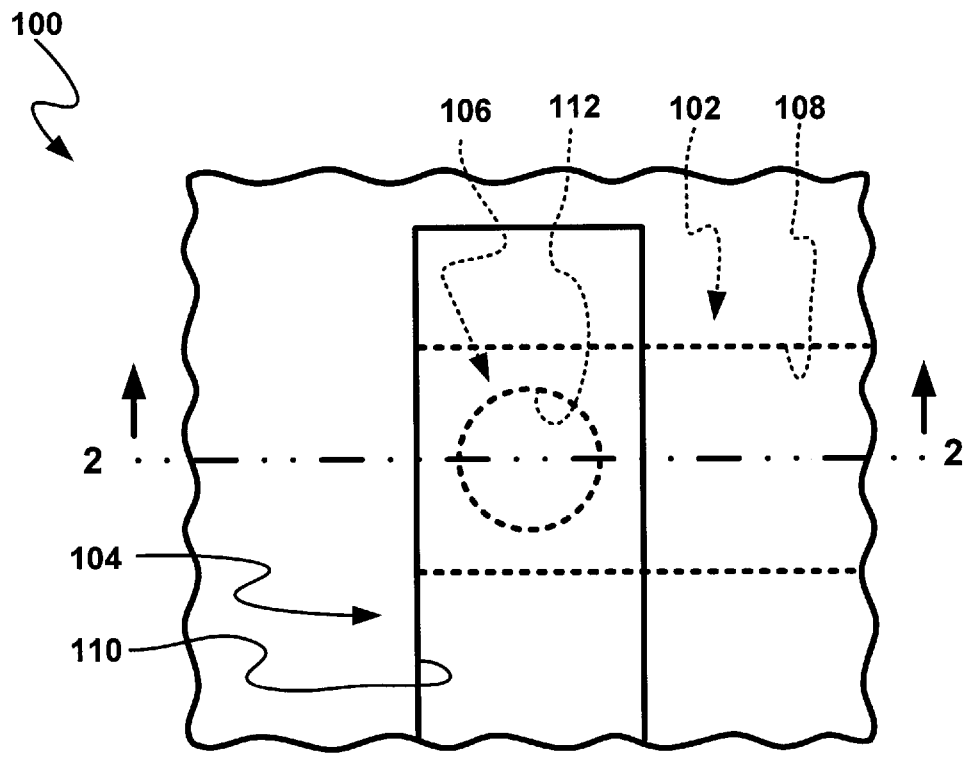
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined and the thickness of the channels and dielectric layers are measured in the vertical direction. Terms, such as "on", "above", "below", "side" (as in "sidewall"), "higher", "lower", "over", and "under", are defined with respect to the horizontal plane.

Figure 2:
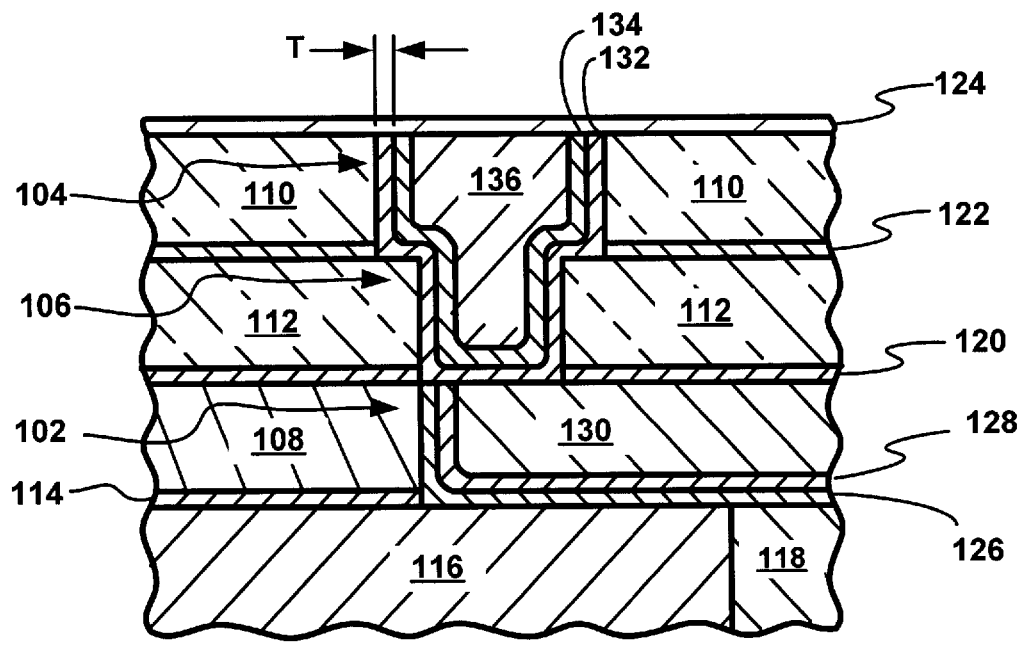
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. As shown, conventional barrier layers 126 and 132 have a thickness "T" since they are used as a chemical-mechanical polishing (CMP) stop for the CMP of the conductor cores 130 and 136. The thickness "T" is required because it is difficult to stop at the conductor core to barrier layer interface and it is expected that some of the barrier layer will be eroded before the CMP process is able to stop.

The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

Figure 3:
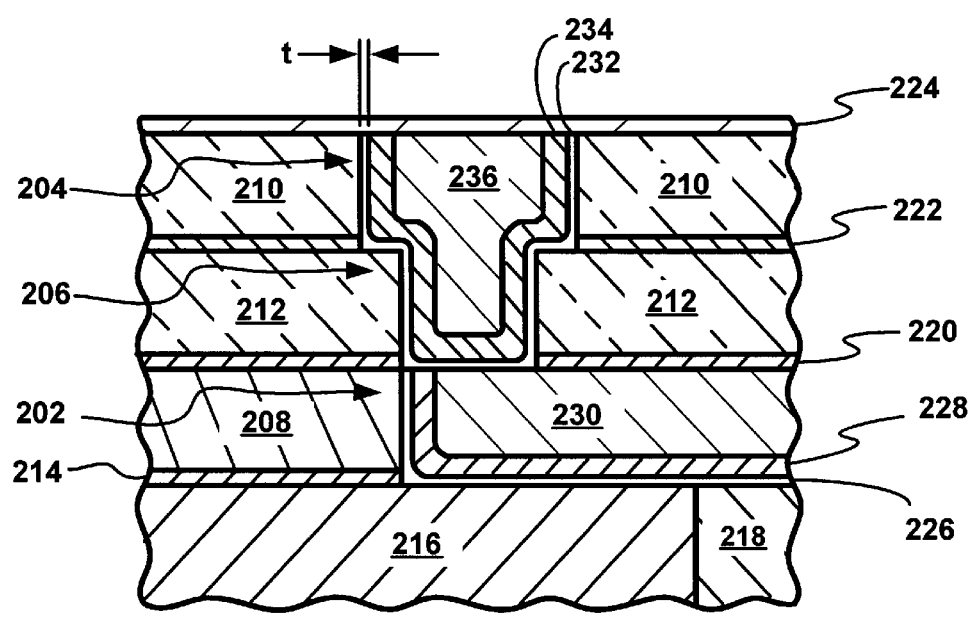
FIG. 3 is a cross-section similar to FIG. 2 (PRIOR ART) showing the reduced barrier layer thickness of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. As shown, the barrier layers 226 and 232 have a thickness "t" which is substantially less than the comparable thickness "T" of the conventional barrier layers 126 and 132 of FIG. 2. In the one embodiment of the present invention, the thickness "t" of the barrier layer is less than 8% of the height of the dielectric layer (and the channel opening) and has a thickness of less than 350 Å. This reduced thickness is possible because of the high selectivity of the chemical portion of the CMP solution as will later be explained. At the same time, the conductor core and barrier layer have a combined thickness less than the thickness of the dielectric layer containing them due to the minimization of the erosion and dishing as will also later be explained.

The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

The barrier layers are of materials such as tantalum (Ta), titanium (Ti), tungsten (W), nitrides thereof, and a combination thereof. The seed layers and conductor cores are of materials such as copper (Cu), copper-base alloys, aluminum (Al), aluminum-base alloys, gold (Au), gold-base alloys, silver (Ag), silver-base alloys, and a combination thereof.

Figure 4:
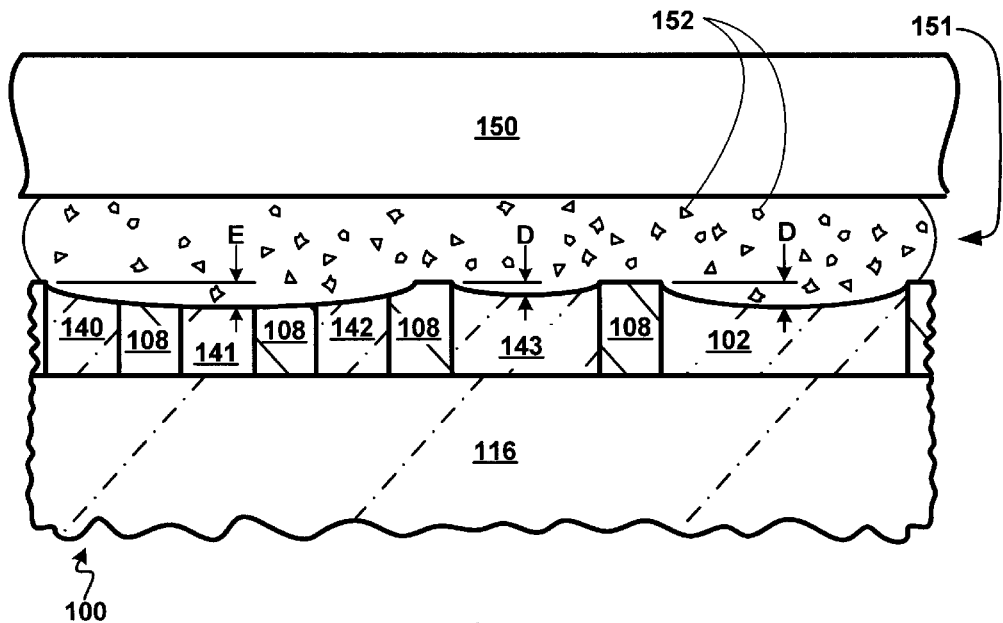
FIG. 4 (PRIOR ART) shows a step in the chemical-mechanical polishing process and depicts the channel erosion and dishing.

Referring now to FIG. 4 (PRIOR ART), therein is shown a step in the CMP process in which a first channel surface of the semiconductor wafer 100 is planarized. Therein is thus shown the planarization of the first channel 102, other channels 140 through 143, and the first channel dielectric layer 108. A flat polishing pad 150 is used with a conventional CMP slurry 151 containing abrasive particles 152. There are a number of different slurries known which consist of sized abrasive particles carried by a CMP solution.

Since the chemical selectivity of the CMP solutions is relatively low, for example for copper to tantalum nitride, they are in the range of 20 to 1, it is necessary to have a relatively thick "T" for the barrier layer 126 shown in FIG. 2 (PRIOR ART). If the barrier layer 126 is too thin, the abrasive will abrade through the barrier layer 126 and the CMP solution will remove both the conductor material, such as copper, as well as the dielectric material, such as silicon oxide, and cause the erosion "E". As seen in FIG. 4 (PRIOR ART), erosion "E" is the formation of a concave depression in the channels 140 through 142 and the first channel dielectric layer 108. Also as seen in FIG. 4 (PRIOR ART), dishing "D" is the formation of concave depressions in the wider or longer channel 143 and the first channel 102, which is also due to the low chemical selectivity. Both erosion and dishing can dramatically change the thickness of the channels and reduce their current-carrying capability.

Figure 5:
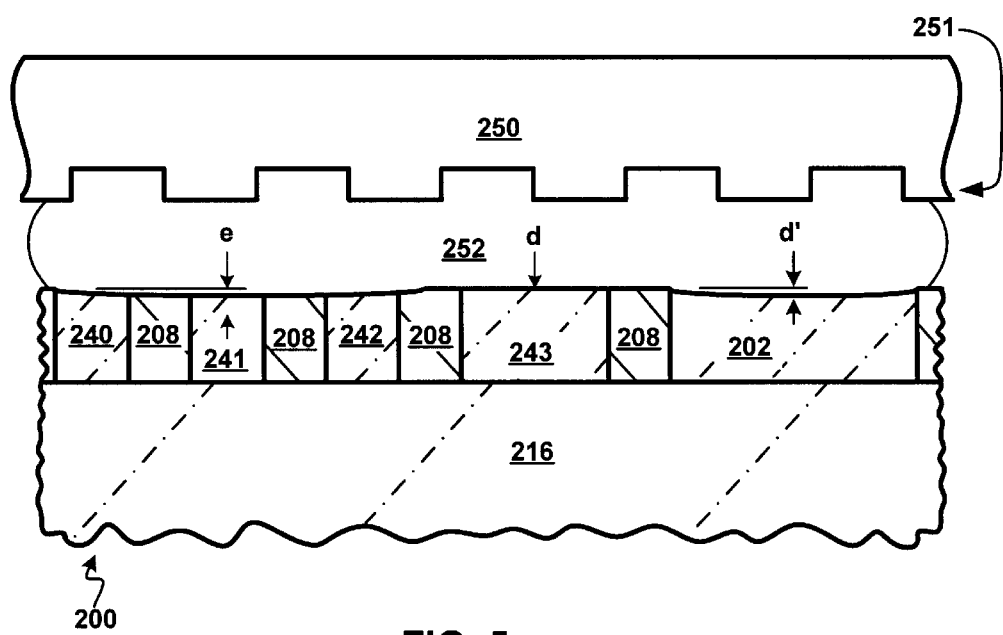
FIG. 5 shows a step in the chemical-mechanical polishing process of the present invention.

Referring now to FIG. 5, therein is shown the CMP step of the present invention in which a first channel surface of the semiconductor wafer 200 is planarized. Therein is thus shown the planarization of the first channel 202, other channels 240 through 243, and the first channel dielectric layer 208. A polishing pad 250 is used which contains grooves 251. A grooved polishing pad of polyurethane used in the present invention is obtainable from Rodel Inc. of Delaware.

An abrasiveless CMP solution 252 is used in the present invention comprised of deionized water containing the following: oxalic acid from 0.1% to 2.0%, benzocriazole from 0.05% to 0.4%, 30%, peroxide solution from 3% to 15% by weight, and Triton™ X-100 from 50 parts per million (ppm) to 100 ppm.

The Triton X-100 is manufactured by Union Carbide but is now well known in the art and is generally available from a number of manufacturers.

Since the chemical selectivity of the abrasiveless CMP solution 252 is very high, for example for copper to tantalum nitride, it is in the range of 300 to 1, it is possible to have a thin "t" for the barrier layer 226 shown in FIG. 3. Even if the barrier layer 226 is too thin, the abrasiveless CMP solution 252 will only remove a very small amount of the conductor material, such as copper, as well as the dielectric material, such as silicon oxide, and cause the erosion "e". As seen in FIG. 5, erosion "e" is the formation of a very shallow concave depression, which is much less than the erosion "E", in the channels 240 through 242 and the first channel dielectric layer 208. Also as seen in FIG. 5, dishing "d" is the formation of a negligible concave depression in the wider or longer channel 243, which is much less than the dishing "D", and the formation of a very shallow concave depression (d')

in the first channel 202, which is also due to the low chemical selectivity. Both erosion and dishing are dramatically reduced by the present invention and the thickness of the channels and their current-carrying capability are maintained.

It has also been found that the grooves 251 assist in in-situ conditioning which improves the CMP process.

As would be evident, each subsequent level of channels will be subject to the above process to form the integrated circuit interconnects.

In the best mode, the barrier layers are of materials such as tantalum (Ta), titanium (Ti), tungsten (W), nitrides thereof, and a combination thereof. The seed layers and conductor cores are of materials such as copper (Cu), copper-base alloys, aluminum (Al), aluminum-base alloys, gold (Au), gold-base alloys, silver (Ag), silver-base alloys, and a combination thereof. The dielectric layers are of silicon dioxide or a low dielectric material such as HSQ, Flare, etc. The stop layers are of materials such as silicon nitride or silicon oxynitride.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:
    providing a semiconductor substrate having a semiconductor device provided thereon;
    forming a dielectric layer on the semiconductor substrate;
    forming a opening in the dielectric layer;
    depositing a barrier layer to line the opening;
    depositing a conductor core over the barrier layer to fill the opening and connect to the semiconductor device; and
    chemical-mechanical polishing the conductor core using a solution having at least a 300:1 selectivity from the conductor core to the dielectric layer.

2. The method of manufacturing an integrated circuit as claimed in claim 1 wherein the chemical-mechanical polishing uses a grooved pad.

3. The method of manufacturing an integrated circuit as claimed in claim 1 wherein the solution is an abrasiveless solution.

4. The method of manufacturing an integrated circuit as claimed in claim 1 wherein the depositing of the barrier layer deposits the barrier layer to a thickness of less than 350 Å.

5. The method of manufacturing an integrated circuit as claimed in claim 1 wherein the depositing of the conductor core deposits a metal selected from a group consisting of copper, aluminum, gold, silver, a compound thereof, and a combination thereof.

6. A method of manufacturing an integrated circuit comprising:
    providing a semiconductor substrate having a semiconductor device provided thereon;
    depositing a device oxide layer on the semiconductor substrate;
    depositing a channel oxide layer on the device oxide layer;
    forming a channel opening in the channel oxide layer;
    depositing a barrier layer to line the channel opening;
    depositing a conductor core to fill the channel opening and connect to the semiconductor device; and
    chemical-mechanical polishing to remove the conductor core and barrier layer to the device oxide layer using a single solution of deionized water containing the following:
        oxalic acid from 0.1% to 2.0%,
        benzotriazole from 0.05% to 0.4%,
        30% peroxide solution from 3% to 15%, and
        Triton X-100 from 50 ppm to 100 ppm.

7. The method of manufacturing an integrated circuit as claimed in claim 6 wherein the chemical-mechanical polishing uses a grooved polyurethane pad.

8. The method of manufacturing an integrated circuit as claimed in claim 6 wherein the solution is an abrasiveless solution.

9. The method of manufacturing an integrated circuit as claimed in claim 6 wherein the depositing of the barrier layer is performed using a material selected from a group consisting of tantalum, titanium, tungsten, a nitride thereof, and a combination thereof.

10. The method of manufacturing an integrated circuit as claimed in claim 6 wherein the depositing of the conductor core deposits the metal selected from a group consisting of copper, aluminum, gold, silver, a compound thereof, and a combination thereof.

* * * * *